US012610849B2

(12) United States Patent
Ho et al.

(10) Patent No.: US 12,610,849 B2
(45) Date of Patent: Apr. 21, 2026

(54) SEMICONDUCTOR PACKAGING STRUCTURE

(71) Applicant: PANJIT INTERNATIONAL INC., Kaohsiung City (TW)

(72) Inventors: Chung Hsiung Ho, Kaohsiung City (TW); Hung Min Liu, Kaohsiung City (TW); Wen Liang Huang, Kaohsiung City (TW); Jeng Sian Wu, Kaohsiung City (TW)

(73) Assignee: PANJIT INTERNATIONAL INC., Kaohsiung City (TW)

( * ) Notice: Subject to any disclaimer, the term of this patent is extended or adjusted under 35 U.S.C. 154(b) by 402 days.

(21) Appl. No.: 18/532,949

(22) Filed: Dec. 7, 2023

(65) Prior Publication Data

US 2025/0132213 A1     Apr. 24, 2025

(30) Foreign Application Priority Data

Oct. 18, 2023     (TW) .................................. 112139727

(51) Int. Cl.
*H10W 74/10*      (2026.01)
*H10P 72/70*      (2026.01)
*H10W 70/685*     (2026.01)
*H10W 74/01*      (2026.01)
*H10W 72/00*      (2026.01)
(Continued)

(52) U.S. Cl.
CPC ....... *H10W 74/114* (2026.01); *H10P 72/7402* (2026.01); *H10W 70/685* (2026.01); *H10W 74/016* (2026.01); *H10W 72/0198* (2026.01); *H10W 74/00* (2026.01); *H10W 90/792* (2026.01); *H10W 90/794* (2026.01)

(58) Field of Classification Search
CPC ............. H10W 74/114; H10W 70/685; H10W 74/016; H10W 72/0198; H10W 74/00; H10W 90/792; H10W 90/794; H10W 72/90; H10W 74/014; H10W 74/019; H10P 72/7402; H10P 72/74
See application file for complete search history.

(56) References Cited

U.S. PATENT DOCUMENTS 11,171,098 B2 *  11/2021  Hu .......................... H10P 72/74

FOREIGN PATENT DOCUMENTS

TW          I813139 B       8/2023

OTHER PUBLICATIONS

TW Office Action dated Mar. 28, 2024 as received in Application No. 112139727.

* cited by examiner

*Primary Examiner* — David Vu
(74) *Attorney, Agent, or Firm* — Maschoff Brennan

(57)     ABSTRACT

A semiconductor packaging structure includes an encapsulation layer, a die, a first metal layer, a second metal layer and an electrical connection component. The die is disposed in the encapsulation layer. The first metal layer and the second metal layer are disposed in the encapsulation layer. The first metal layer and the second metal layer are disposed on opposite sides of the die, respectively. The electrical connection component is disposed in the encapsulation layer. The first metal layer is electrically connected with the second metal layer through the electrical connection component. The electrical connection component includes a non-metal core and a metal film located on a surface of the non-metal core.

10 Claims, 9 Drawing Sheets

(51) Int. Cl.
    *H10W 74/00*          (2026.01)
    *H10W 90/00*          (2026.01)

SEMICONDUCTOR PACKAGING STRUCTURE

This application claims priority under 35 U.S.C. § 119(a) on Patent Application No(s). 112139727 filed in Taiwan, R.O.C. on Oct. 18, 2023, the entire contents of which are hereby incorporated by reference.

BACKGROUND

1. Technical Field

The present disclosure relates to a semiconductor packaging structure, more particularly to a semiconductor packaging structure for panel-level packaging.

2. Related Art

Panel-level packaging is a process of dicing wafers into a large number of dies, arranging and bonding these dies to a carrier, and then simultaneously packaging these dies in the same process step. Panel-level packaging has received widespread attention as a novel technology in recent years. Compared to conventional wafer-level packaging, panel-level packaging has the advantages of high production efficiency, low production costs, and suitability for mass production.

SUMMARY

According to one aspect of the present disclosure, a semiconductor packaging structure includes an encapsulation layer, a die, a first metal layer, a second metal layer and an electrical connection component. The die is disposed in the encapsulation layer. The first metal layer and the second metal layer are disposed in the encapsulation layer. The first metal layer and the second metal layer are disposed on opposite sides of the die, respectively. The electrical connection component is disposed in the encapsulation layer. The first metal layer is electrically connected with the second metal layer through the electrical connection component. The electrical connection component includes a non-metal core and a metal film located on a surface of the non-metal core.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

In one aspect, copper blocks are generally used as the electrical connection components for panel-level packaging, in order to electrical connect different wiring layers. The development of panel-level packaging is trending towards high component density. However, since the fabrication of the copper blocks involves cutting or etching process for the treatment of a copper board, the lateral surfaces of the copper blocks may have burrs or undulations, which results in the difficulty to reduce the spacing between the copper block and the neighboring die.

One aspect of the present disclosure provides a semiconductor packaging structure to improve or solve the one or more aforementioned problems.

Figure 1:
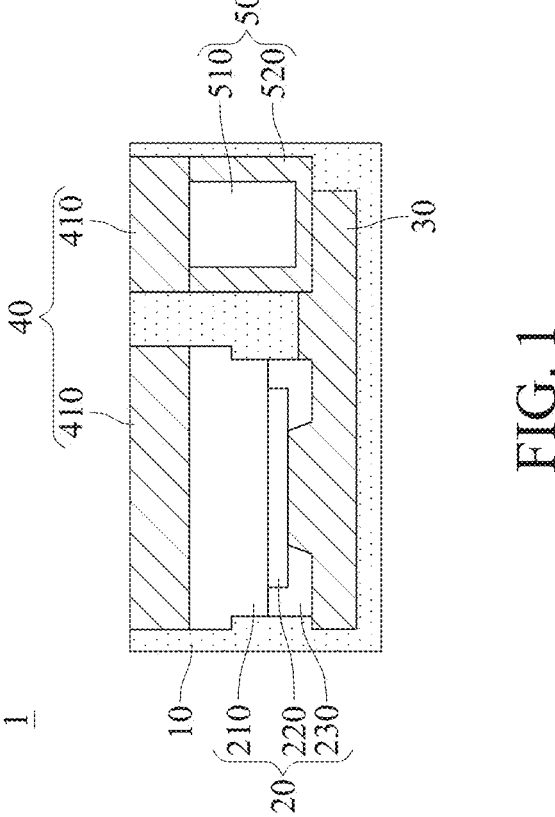
FIG. 1 is a schematic view of a semiconductor packaging structure according to an embodiment of the present disclosure.

Please refer to FIG. 1 which is a schematic view of a semiconductor packaging structure according to an embodiment of the present disclosure. In this embodiment, a semiconductor packaging structure 1 includes an encapsulation layer 10, a semiconductor element 20, a metal layer 30, a metal layer 40 and an electrical connection component 50.

The encapsulation layer 10 may be made of organic composite material, epoxy composite material, macromolecule composite material, polymer composite material or other epoxy molding compounds. For example, the encapsulation layer 10 may be an epoxy resin encapsulation layer.

The semiconductor element 20 is disposed in the encapsulation layer 10. The semiconductor element 20 may include a die 210 disposed in the encapsulation layer 10, an interconnect metal 220 and a protective layer 230. The die 210 may be made of semiconductor material such as silicon, silicon carbide or III-V compound semiconductor. The interconnect metal 220 is formed on a surface at one side of the die 210. In one embodiment, the protective layer 230 is preferably formed on the top side of the die 210 and exposes the interconnect metal 220. The protective layer 230 can provide adequate cushioning and support for the semiconductor element 20 so as to prevent the semiconductor element 20 from cracking due to squeeze by the encapsulation layer 10 or the metal layers 30, 40.

The metal layer 30 is disposed in the encapsulation layer 10. The metal layer 30 may fill the opening in the protective layer 230 and electrically connected with the interconnect metal 220. The metal layer 40 is disposed in the encapsulation layer 10. The metal layer 30 and the metal layer 40 are disposed on opposite sides of the semiconductor element 20, respectively. Specifically, the interconnect metal 220, the protective layer 230 and the metal layer 30 may be disposed on the front surface of the die 210, and the metal layer 40 may be disposed on the back surface of the die 210.

The electrical connection component 50 is disposed in the encapsulation layer 10, and the electrical connection component 50 includes a non-metal core 510 and a metal film 520 located on a surface of the non-metal core 510. The metal layer 30 is electrically connected with the metal layer 40 through the electrical connection component 50. The interconnect metal 220 of the semiconductor element 20 may be electrically coupled to the metal layer 40 through the metal layer 30 and the metal film 520 of the electrical connection component 50. In detail, the electrical signals may pass from the interconnect metal 220 through the metal layer 30 and the electrical connection component 50 in sequence to reach the metal layer 40.

In this embodiment, the non-metal core 510 of the electrical connection component 50 may be non-conductive. Specifically, the non-metal core 510 may be made of silicon. Herein, the non-metal core 510 may be made of electrical insulating material. More specifically, the non-metal core 510 may be made of made of undoped silicon, silicon nitride, silicon oxide or molding compound resin.

In this embodiment, the metal film 520 of the electrical connection component 50 may be made of the same material as the metal layers 30, 40. Specifically, the metal film 520 as well as the metal layers 30, 40 may be all made of copper, or each may include at least part made of copper.

In this embodiment, the die 210 of the semiconductor element 20 as well as the electrical connection component 50 may be located at the same layer. Specifically, the semiconductor element 20 and the electrical connection component 50 may be disposed on the same carrier, and the encapsulation layer 10 is formed to surround the semiconductor element 20 and the electrical connection component 50.

In this embodiment, the encapsulation layer 10 may expose at least one of the metal layer 30 and the metal layer 40. Specifically, the encapsulation layer 10 may expose the metal layer 40, and the metal layer 40 may include two metal pads 410 spaced apart from each other. The metal pads 410 are connected with the semiconductor element 20 and the metal film 520 of the electrical connection component 50, respectively. Specifically, one of the metal pads 410 is disposed on the back surface of the die 210, and the other metal pad 410 is connected to the metal film 520. In some other embodiments, the encapsulation layer 10 may expose both the metal layer 30 and the metal layer 40.

Figure 2:
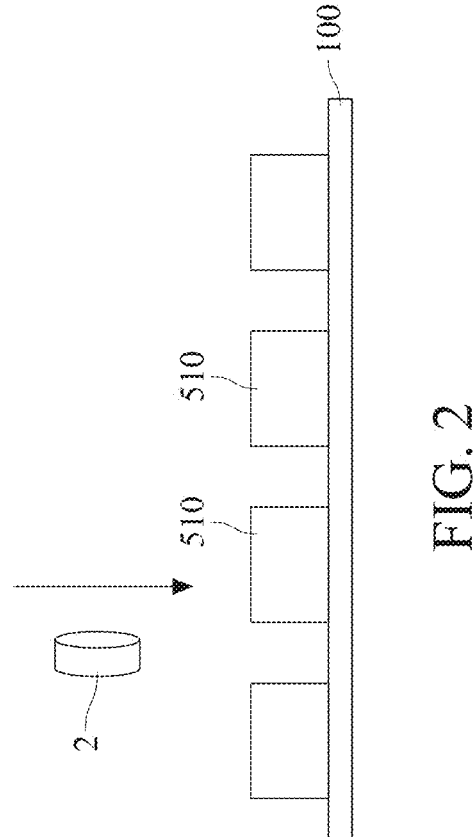
FIG. 2 through FIG. 5 are schematic views showing fabrication of an electrical connection component for a semiconductor packaging structure according to an embodiment of the present disclosure.

FIG. 2 through FIG. 5 are schematic views showing fabrication of an electrical connection component for a semiconductor packaging structure according to an embodiment of the present disclosure. As shown in FIG. 2, a tape or a substrate with adhesiveness is provided as a temporary carrier 100, and a silicon wafer is provided on the temporary carrier 100. The silicon wafer is divided into multiple silicon blocks by a cutter 2. Each of the silicon blocks can be served as the non-metal core 510 of single electrical connection component 50.

Figure 3:
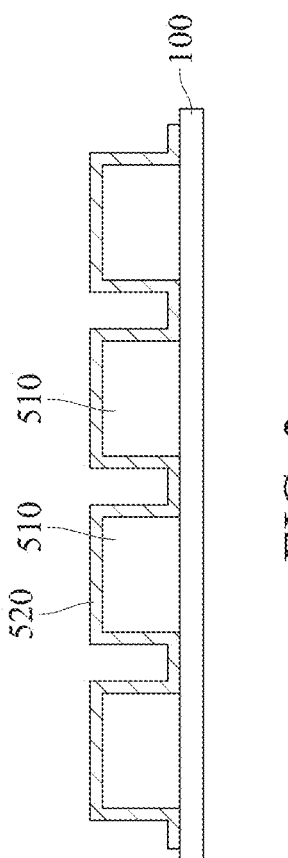
Figure 4:
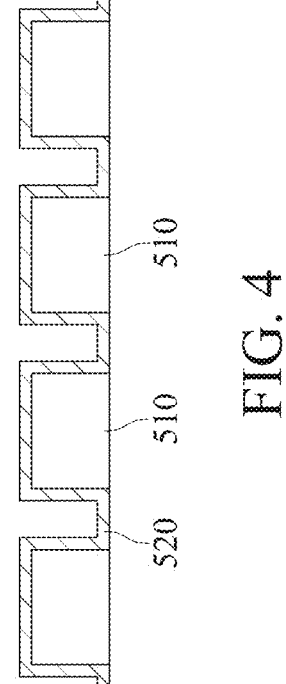
Figure 5:
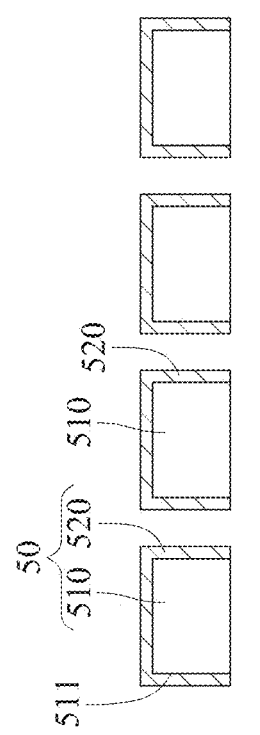

As shown in FIG. 3, a metal film 520 is formed on the non-metal core 510. Specifically, a copper film may be deposited on the surface of the non-metal core 510 as the metal film 520 by sputtering, electroplating, or chemical plating as metal film 520. As shown in FIG. 4 and FIG. 5, the temporary carrier 100 is removed, and the copper film (metal film 520) is trimmed to obtain multiple electrical connection components 50. Moreover, before the deposition of copper film, a titanium film or a nickel film may be optionally deposited on the surface of non-metal core 510 as an adhesive layer to prevent copper film flaking.

Figure 6:
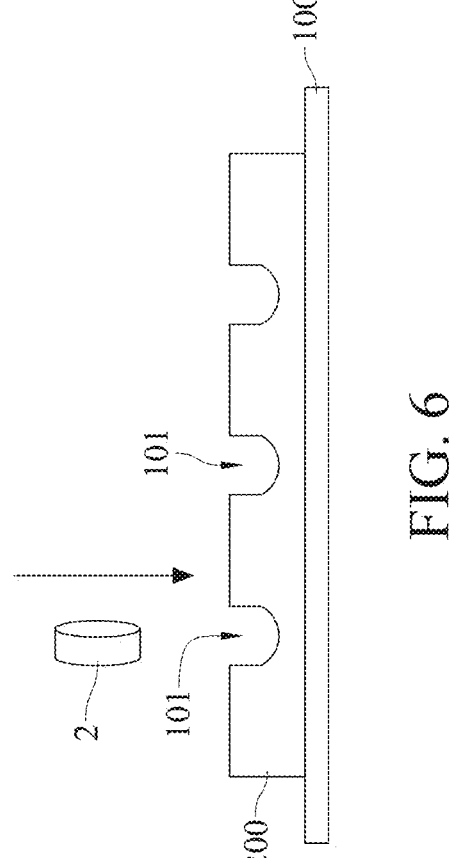
FIG. 6 through FIG. 9 are schematic views showing fabrication of an electrical connection component for a semiconductor packaging structure according to another embodiment of the present disclosure.

FIG. 6 through FIG. 9 are schematic views showing fabrication of an electrical connection component for a semiconductor packaging structure according to another embodiment of the present disclosure. As shown in FIG. 6, a tape or a substrate with adhesiveness is provided as a temporary carrier 100, and a silicon wafer 200 is disposed on the temporary carrier 100. The silicon wafer is processed by a cutter 2 to form multiple trenches 101.

Figure 7:
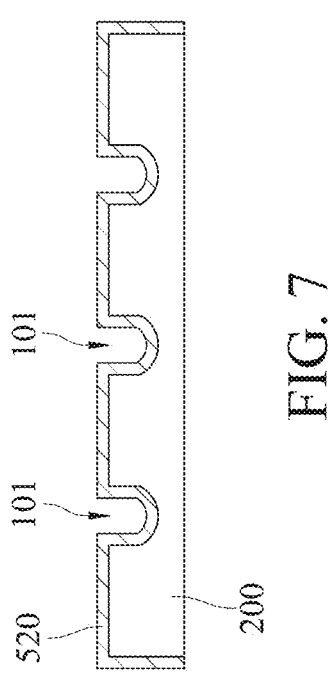

As shown in FIG. 6 and FIG. 7, the temporary carrier 100 is removed, and a metal film 520 is formed on the surface of the silicon wafer 200 and in the trenches 101. Specifically, a copper film may be deposited as the metal film 520 by sputtering, electroplating, or chemical plating as metal film 520.

Figure 8:
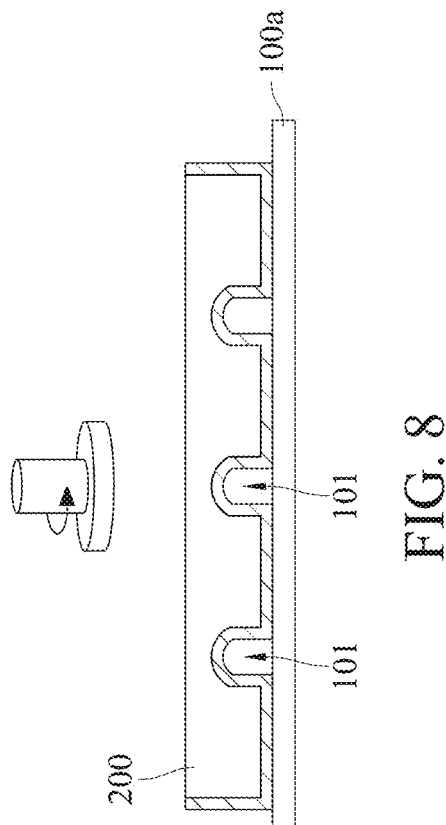
Figure 9:
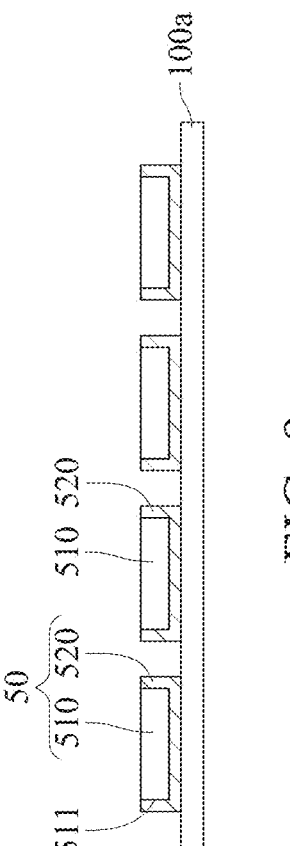

As shown in FIG. 7 and FIG. 8, the silicon wafer 200 including the metal film 520 is transferred to another temporary carrier 100a. As shown in FIG. 8 and FIG. 9, the silicon wafer 200 is thinned to form multiple electrical connection components 50. Specifically, the silicon wafer 200 may be reduced in thickness by processing chemical-mechanical polishing (CMP) at one side of the silicon wafer 200 without the trenches 101, and thus multiple silicon blocks with metal film 520 thereon are obtained. Each of the silicon blocks can be served as the non-metal core 510 of single electrical connection component 50.

Referring to FIG. 5 and FIG. 9, since the non-metal core 510 (silicon block), formed by full-cutting the silicon wafer or by half-cutting and grinding the silicon wafer, has a flat lateral surface 511, the electrical connection component 50 also has a flat lateral surface. That is, the metal film 520 is flat on the lateral surface 511, and the metal film 520 is presented without burrs or undulations on the lateral surface 511. The electrical connection component 50 fabricated according to FIG. 2 through FIG. 9 may be applicable to a panel level packaging structure.

Figures 10, 11:
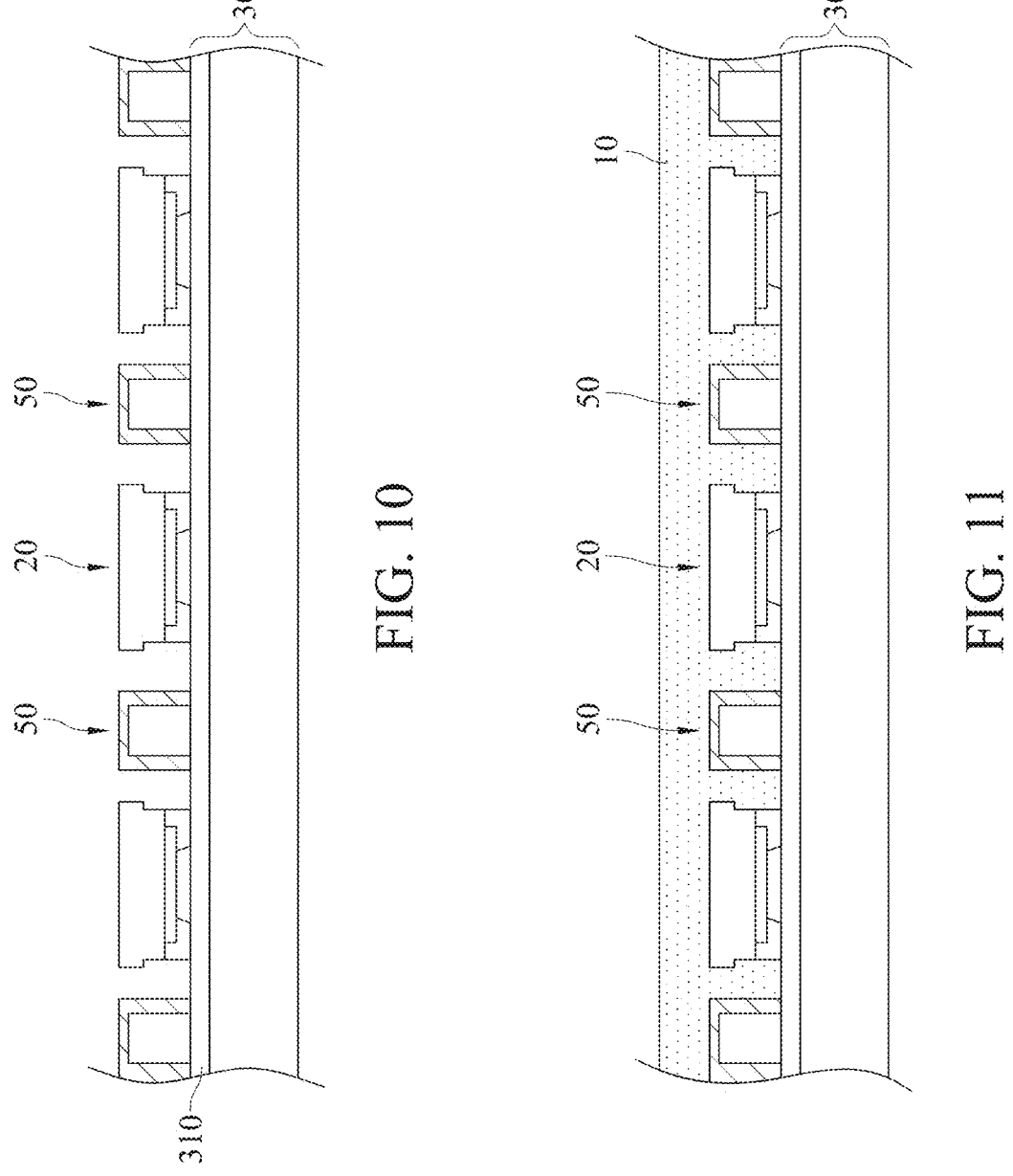
FIG. 10 through FIG. 17 are schematic views showing a process flow of fabricating the semiconductor packaging structure in FIG. 1.

FIG. 10 through FIG. 17 are schematic views showing a process flow of fabricating the semiconductor packaging structure in FIG. 1. As shown in FIG. 10, a substrate is provided as a temporary carrier 300 including a release layer 310, and one or more electrical connection components 50 as well as one or more semiconductor elements 20 are disposed on the temporary carrier 300. Each semiconductor element 20 is located between adjacent two electrical connection components 50. The semiconductor element 20 and the electrical connection component 50 may be located at the same layer; that is, the semiconductor element 20 and the electrical connection component 50 may be at the same horizontal height. The release layer 310 may be a heat released tape.

As shown in FIG. 11, an encapsulation layer 10 is formed on the temporary carrier 300 to cover the electrical connection components 50 and the semiconductor elements 20. The formation of the encapsulation layer 10 may be implemented by injection molding, thermoforming or the like.

Figures 12, 13:
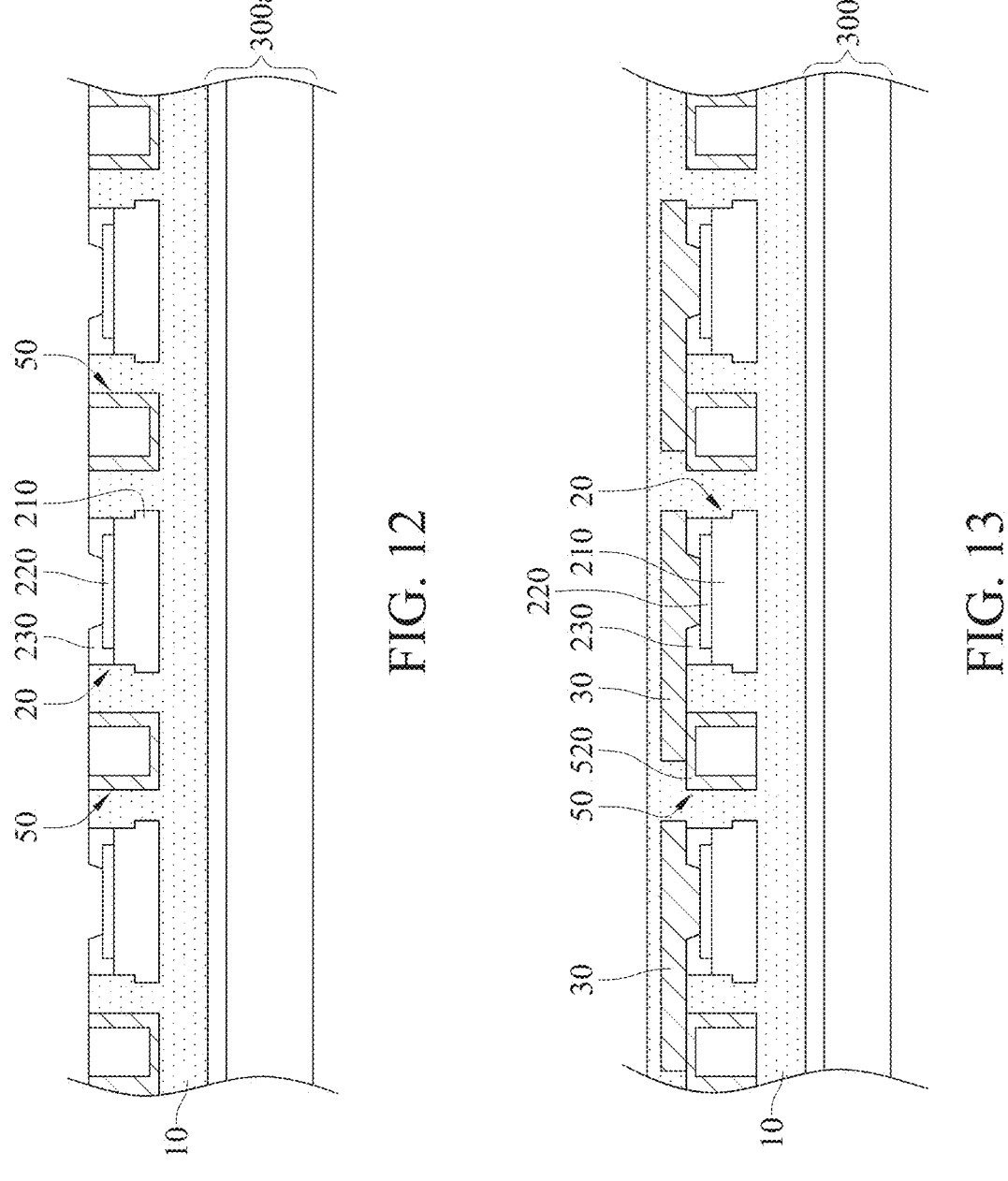

As shown in FIG. 11 and FIG. 12, the temporary carrier 300 is removed, and a module including the encapsulation layer 10, the semiconductor elements 20 and the electrical connection components 50 is transferred to another temporary carrier 300a. Specifically, said module is flipped over and disposed on the temporary carrier 300a including a release layer. Thus, a front side of the semiconductor element 20 is exposed to outside; that is, the interconnect metal 220 and the protective layer 230 at the front surface of the die 210 are exposed to outside.

As shown in FIG. 13, one or more metal layers 30 are formed on the encapsulation layer 10, and the metal layer 30 is electrically connected with the interconnect metal 220 of the corresponding semiconductor element 20 and the metal film 520 of the corresponding electrical connection component 50. Specifically, the metal layer 30 corresponds to one of the semiconductor elements 20 and one electrical connection component 50 adjacent to this semiconductor element 20. The metal layer 30 is filled into an opening formed by the protective layer 230 so as to introduce the interconnect metal 220 out. The metal layer 30 is also electrically connected with the metal film 520 of the corresponding electrical connection component 50. The metal layer 30 may be formed by a deposition process, such as sputtering, physical vapor deposition (PVD) and chemical vapor deposition (CVD), as well as a patterning process, such as etching and imprinting. After the formation of the metal layer 30, the encapsulation layer 10 is thicken to cover the metal layer 30.

Figures 14, 15:
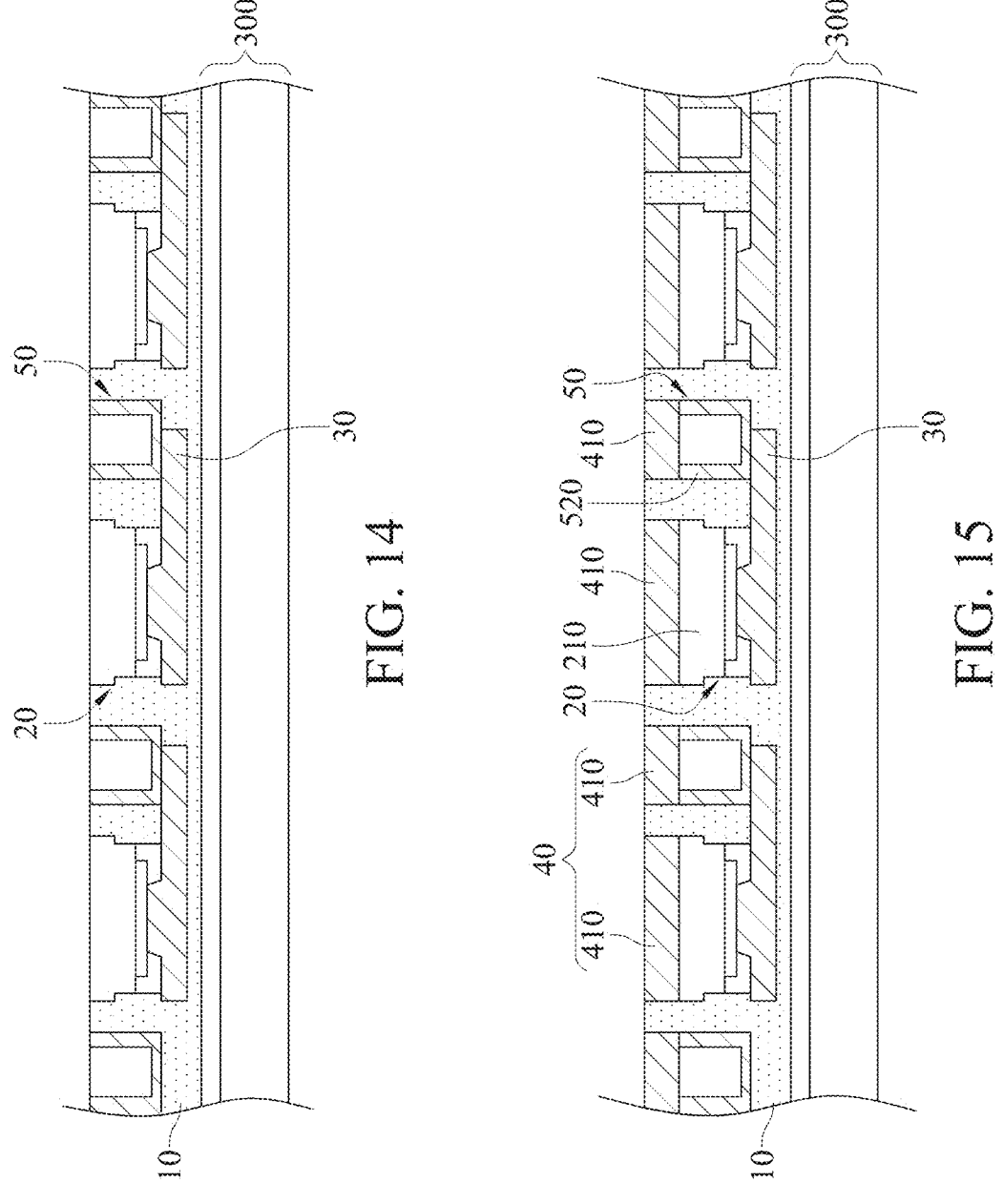

As shown in FIG. 13 and FIG. 14, the temporary carrier 300a is removed, and a module including the encapsulation layer 10, the semiconductor elements 20, the electrical connection components 50 and the metal layers 30 is transferred to another temporary carrier 300b. Specifically, said module is flipped over and disposed on the temporary carrier 300b. Thus, a back side of the semiconductor element 20 is exposed to outside; that is, the back surface of the die 210 are exposed to outside. Also, since the encapsulation layer 10 covers the metal layer 30, the metal layer 30 is spaced apart from the temporary carrier 300b in a vertical direction in FIG. 14.

As shown in FIG. 15, one or more metal layers 40 are formed on the encapsulation layer 10, and the metal layer 40 is electrically connected with the die 210 of the semiconductor element 20 and the metal film 520 of the electrical connection component 50. Specifically, some metal pads 410 of the metal layer 40 are disposed corresponding to the semiconductor elements 20, and some other metal pads 410 are disposed corresponding to the electrical connection components 50. As to any adjacent metal pads 410, one metal pad 410 is disposed on the back surface of the die 210, and the other is metal pad 410 is disposed on the electrical connection component 50 and electrically connected with the metal film 520. After the formation of the metal layer 40, the encapsulation layer 10 is thicken to cover the metal layer 40, and then the encapsulation layer 10 is thinned to expose the top surface of the metal pad 410. The metal layer 40 may be formed by deposition process, such as sputtering, PVD and CVD, as well as a patterning process, such as etching and imprinting. The encapsulation layer 10 may be thinned by CMP. Optionally, the metal layer 40 may be processed by surface treatment to form electroless nickel immersion gold (ENIG).

Figure 16:
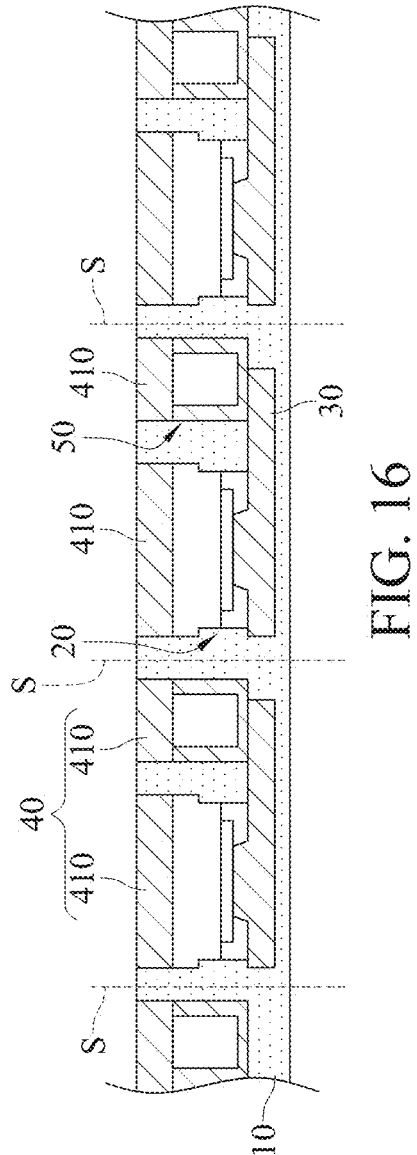
Figure 17:
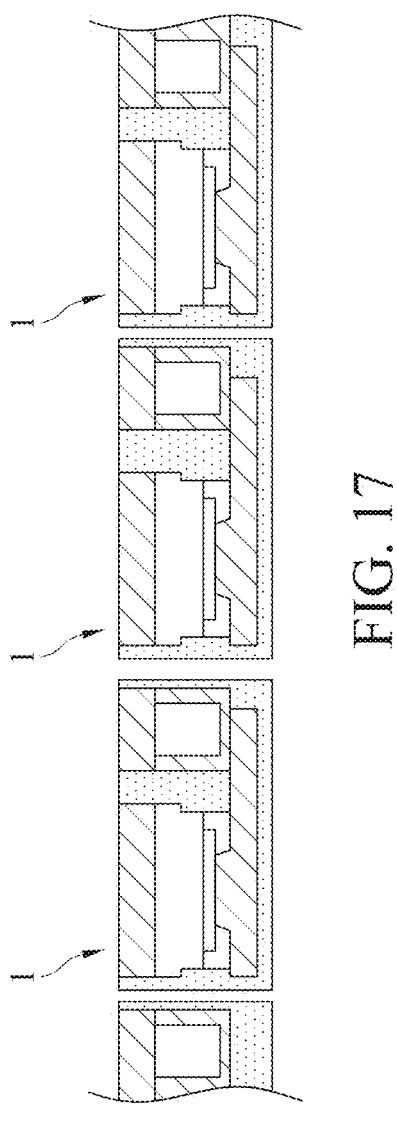

As shown in FIG. 15 and FIG. 16, the temporary carrier 300b is removed to obtain a module including the encapsulation layer 10, the semiconductor elements 20, the electrical connection components 50 and the metal layers 30, 40. As shown in FIG. 16 and FIG. 17, the encapsulation layer 10 is full-cut along a predetermined dicing path S to obtain multiple semiconductor packaging structures 1.

According to the present disclosure, the electrical connection component, configured to electrically connect two metal layers at opposite sides of a semiconductor element, includes a non-metal core and a metal film. In one implementation, the non-metal core is selected from a substrate capable of forming flat cross section after dicing, such as a silicon wafer with single orientation. In one another implementation, the non-metal core is selected from molding compound resin enjoying low processing costs. Therefore, a non-metal core generated by a non-metal substrate has a flat lateral surface, and the metal film coated thereon also has a flat lateral surface. The use of this electrical connection component for panel-level packaging is favorable for preventing burrs or undulations on the electrical connection component. The electrical connection component without burrs or undulations can prevent electrical short between the electrical connection component and a neighboring semiconductor element, such that it is favorable for reduce a horizontal spacing therebetween, thereby achieving high component density.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A semiconductor packaging structure, comprising:
an encapsulation layer;
a die disposed in the encapsulation layer;
a first metal layer and a second metal layer disposed in the encapsulation layer, wherein the first metal layer and the second metal layer are disposed on opposite sides of the die, respectively; and
an electrical connection component disposed in the encapsulation layer, wherein the first metal layer is electrically connected with the second metal layer through the electrical connection component;
wherein, the electrical connection component comprises a non-metal core and a metal film located on a surface of the non-metal core.

2. The semiconductor packaging structure according to claim 1, wherein the non-metal core is non-conductive.

3. The semiconductor packaging structure according to claim 1, wherein the non-metal core is made of undoped silicon, silicon nitride, silicon oxide or molding compound resin.

4. The semiconductor packaging structure according to claim 1, wherein the metal film is made of same material as the first metal layer and the second metal layer.

5. The semiconductor packaging structure according to claim 1, wherein a lateral surface of the electrical connection component is flat.

6. The semiconductor packaging structure according to claim 1, wherein a lateral surface of the non-metal core is flat.

7. The semiconductor packaging structure according to claim 1, wherein the first metal layer and the second metal layer are electrically connected with the metal film of the electrical connection component.

8. The semiconductor packaging structure according to claim 1, wherein the die and the electrical connection component are located at same layer.

9. The semiconductor packaging structure according to claim 1, wherein the encapsulation layer exposes at least one of the first metal layer and the second metal layer.

10. The semiconductor packaging structure according to claim 1, wherein the encapsulation layer exposes the second metal layer, the second metal layer comprises two metal pads spaced apart from each other, and the two metal pads are connected with the die and the metal film of the electrical connection component, respectively.

* * * * *